(12) United States Patent
Cohn

(10) Patent No.: US 6,322,938 B1
(45) Date of Patent: Nov. 27, 2001

(54) NANOLITHOGRAPHY FOR MULTI-PASSBAND GRATING FILTERS

(75) Inventor: Robert W. Cohn, Louisville, KY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/575,252

(22) Filed: May 22, 2000

(51) Int. Cl.$^7$ .................................. G03F 7/00; G02B 5/18
(52) U.S. Cl. .......................... 430/8; 430/321; 250/492.1; 250/492.2; 250/492.3
(58) Field of Search .................... 430/8, 321; 250/492.1, 250/493.1, 494.1

(56) References Cited

U.S. PATENT DOCUMENTS 5,252,835  * 10/1993  Lieber et al. ...................... 250/492.1
6,013,396  *  1/2000  Capodieci ................................ 430/5

FOREIGN PATENT DOCUMENTS 195 44 295 A  *  6/1997  (DE) .

* cited by examiner

Primary Examiner—John A. McPherson
(74) Attorney, Agent, or Firm—William G. Auton

(57) ABSTRACT

The placement accuracy and resolution of direct-write patterning tools, in particular the atomic force microscope (AFM), is considered for application to fabricating multi-passband integrated optical filters. Because of its simpler fabrication a grating structure is proposed that consists of identical stripes that are non-periodically spaced. The recently developed pseudorandom encoding method from the field of computer generated holography is modified to effectively assign analog reflectances at each point along the grating by selective withdrawal and offsetting of the stripes from a periodic spacing. An example filter designed by this method has two 1.5 nm bandwidth passbands and −23 dB of rejection for lightly coupled stripes. As with single band filters, the passbands broaden as the coupling increases. A calculation of the coupling coefficient of stripes on a fundamental mode, slab waveguide indicate that stripes on the order of 100 nm in depth and width support low insertion loss, multipassband filtering applications at visible wavelengths. Lines of these dimensions patterned with an AFM on (110) silicon indicate the feasibility of fabricating these filters. These conclusions are specific to current AFMs that are limited to writing fields of 100 μm. Increased rejection and decreased passband widths will result from incorporating precise field-stitching into future AFMs.

2 Claims, 7 Drawing Sheets

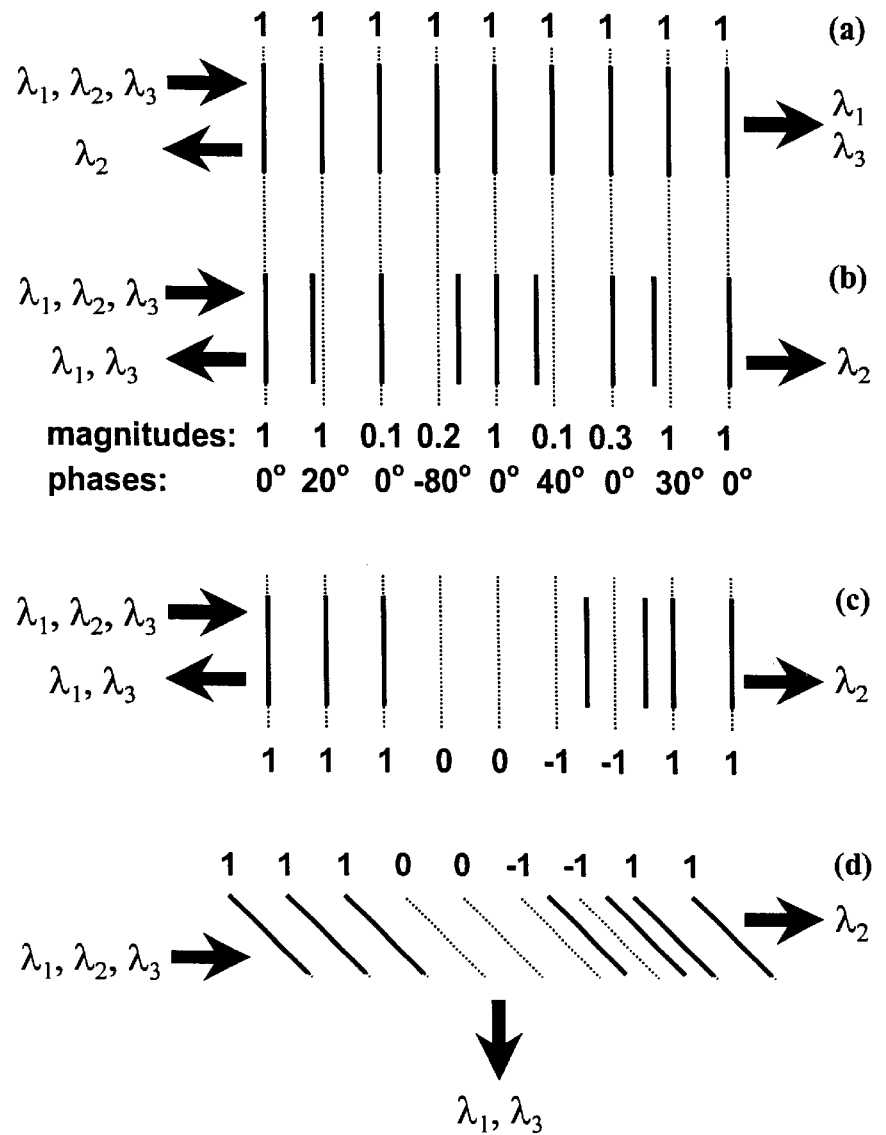

Figure 1. Types of reflection filters. (a) Periodic reflectors which cause unit amplitude reflections that are separated by optical path differences of period $\lambda_0$, (b) aperiodic reflectors that through offsets and variable reflection strengths represent arbitrary complex valued reflectances, (c) proposed aperiodic structure that through $\lambda_0/2$ offsets and pseudorandom encoding algorithms represents the continuum of real values between -1 to 1, (d) proposed aperiodic structure with tilted reflectors. The dotted lines indicate the sampling grid for the periodic filter.

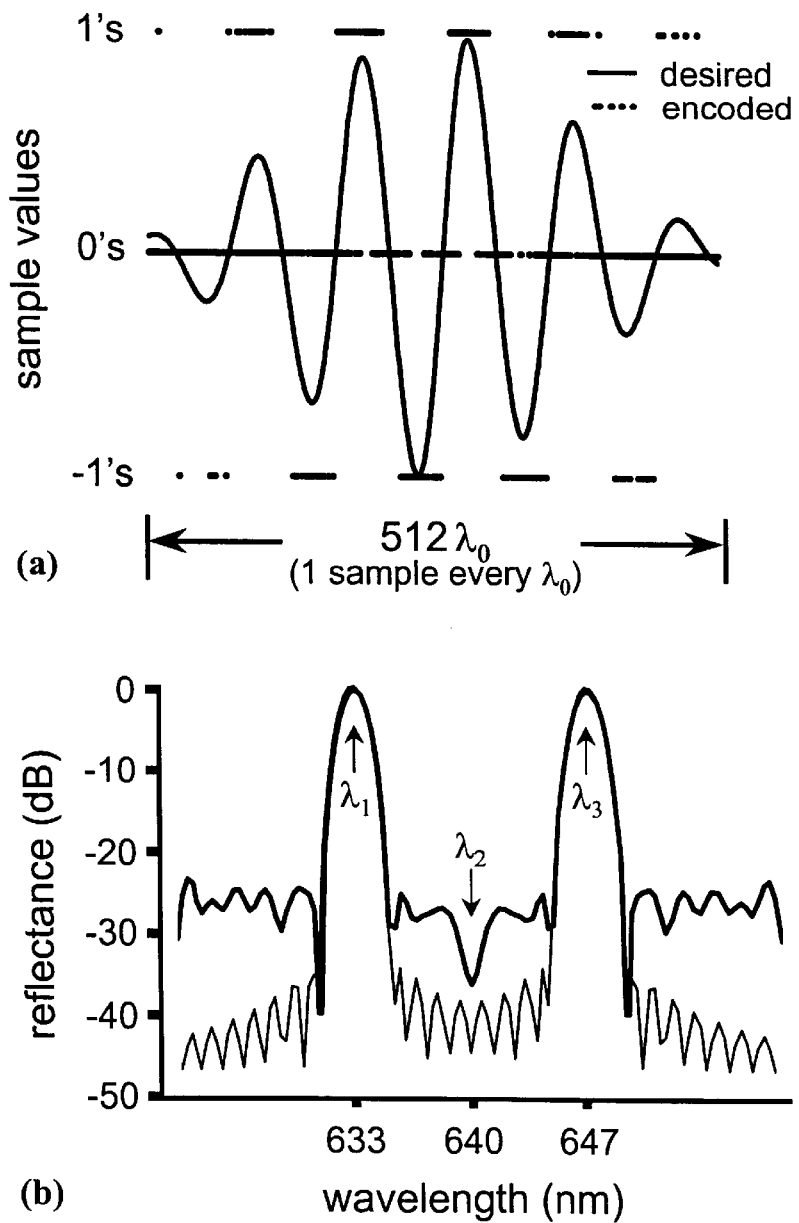

Figure 2. Pseudorandom encoding of dual passband filter. (a) Desired real-valued reflectances and the desired function encoded with the three available values -1, 0 and 1. (b) The reflectance power spectra derived from the Fourier transforms of the temporal functions in (a). The thin line is the spectrum for the desired function and the thick line is the spectrum for the encoded function.

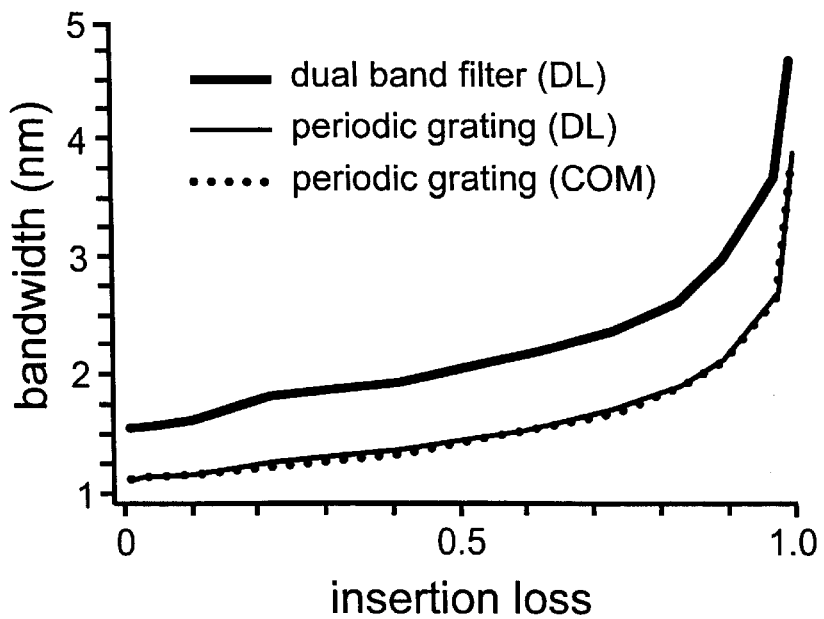

Figure 3. Bandwidth at -3 dB of peak intensity for a single passband (512 period) grating filter and the dual passband grating filter as a function of filter insertion loss. The correspondence between the COM (coupling of modes) and DL (discrete layer) analyses for the periodic structure indicates the validity of the DL analysis for the analysis of the non-periodic dual passband filter.

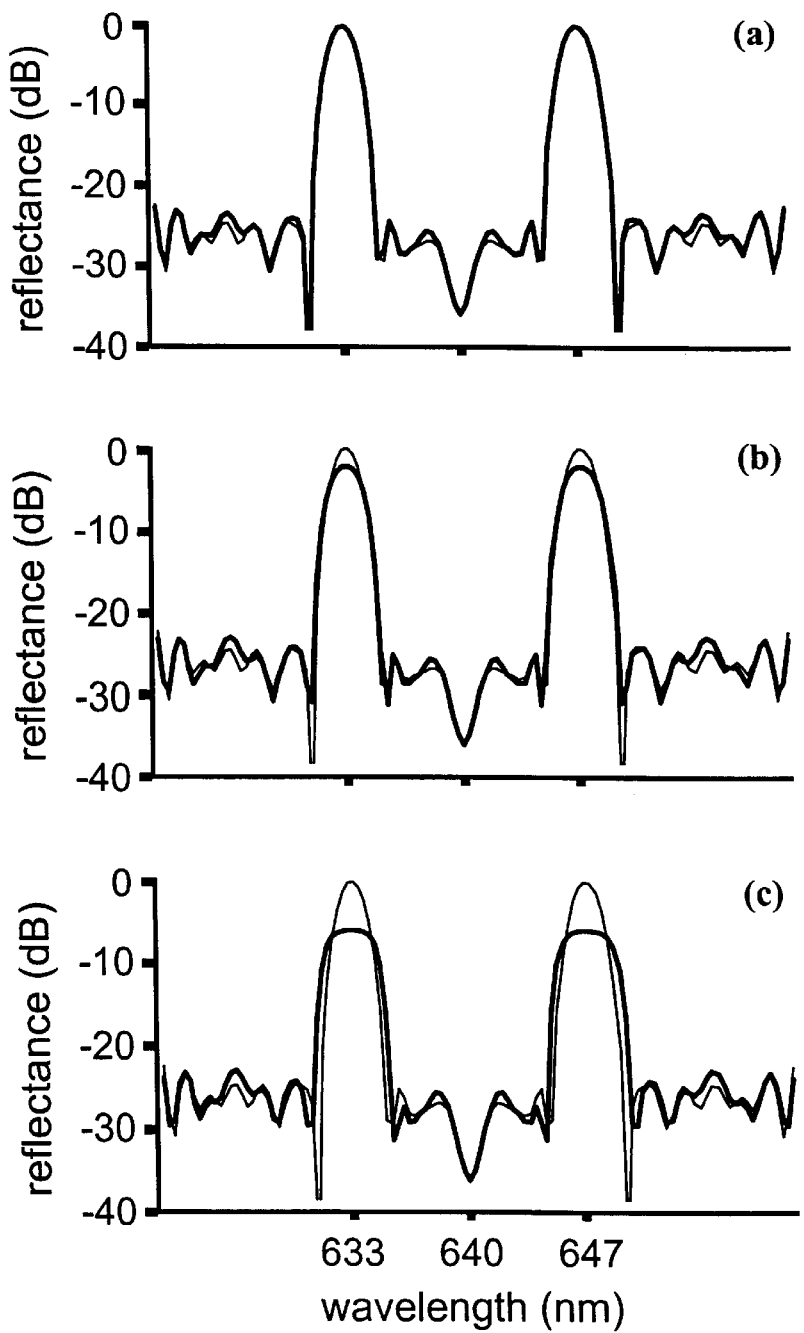

Figure 4. Reflectance spectra for the dual passband filter design. The DL analyses (thick lines) are shown for filter insertion loss (i.e. peak intensity reflectance at centerband) of (a) 0.068, (b) 0.532 and (c) 0.917. The spectrum for the dual passband design from Fig. 2 is also replotted (thin line) for comparison. The reflectance spectra are normalized so as to bring their sidelobe structure into correspondence with the design spectrum.

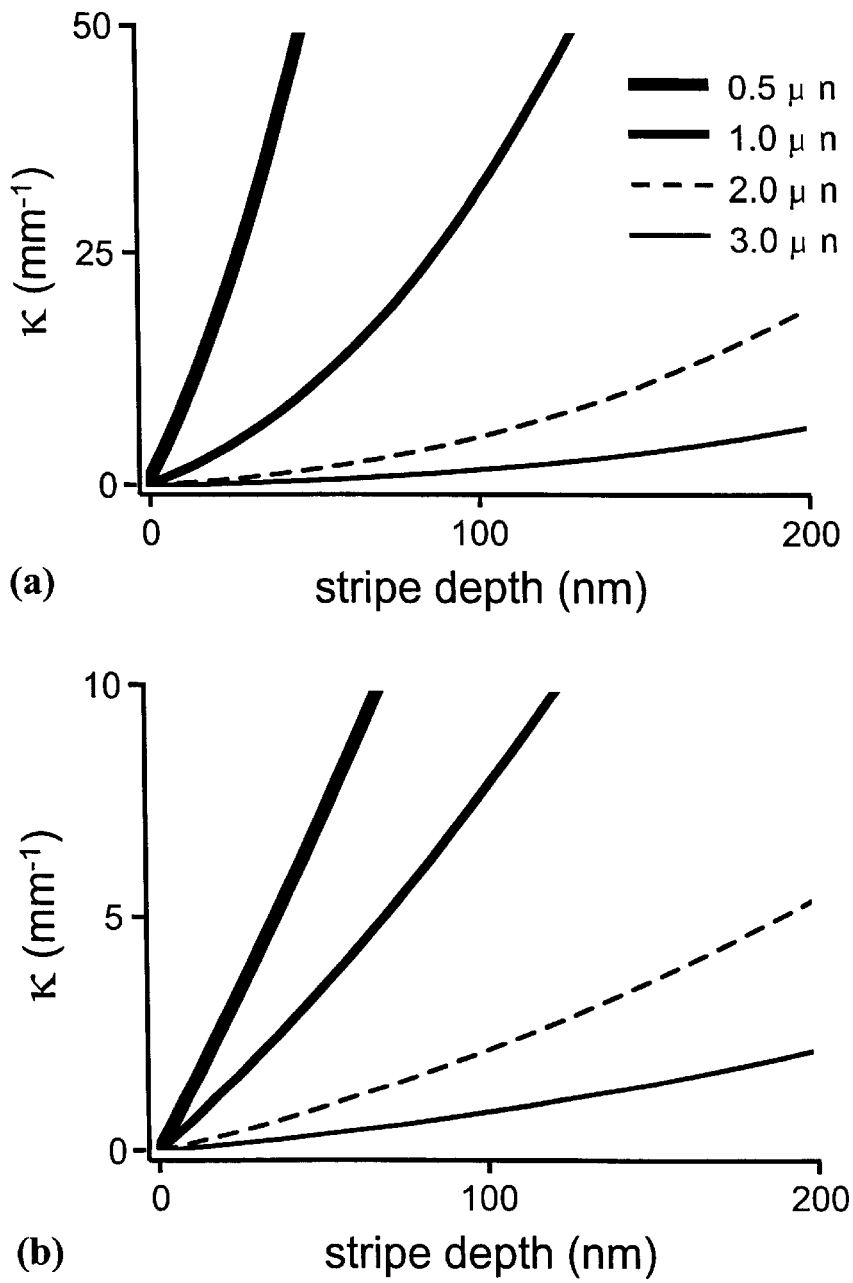
Figure 5. Reflected wave coupling strength for a periodic grating on a symmetric slab waveguide. The results shown are for the fundamental TE mode of the guide, guiding layers of thickness between 0.5 and 3.0 µm, and a 50 % duty cycle grating of 512 periods. The curves are for cladding index $n_c=1$ and for guide index (a) $n_g=1.5$ and (b) $n_g=1.05$.

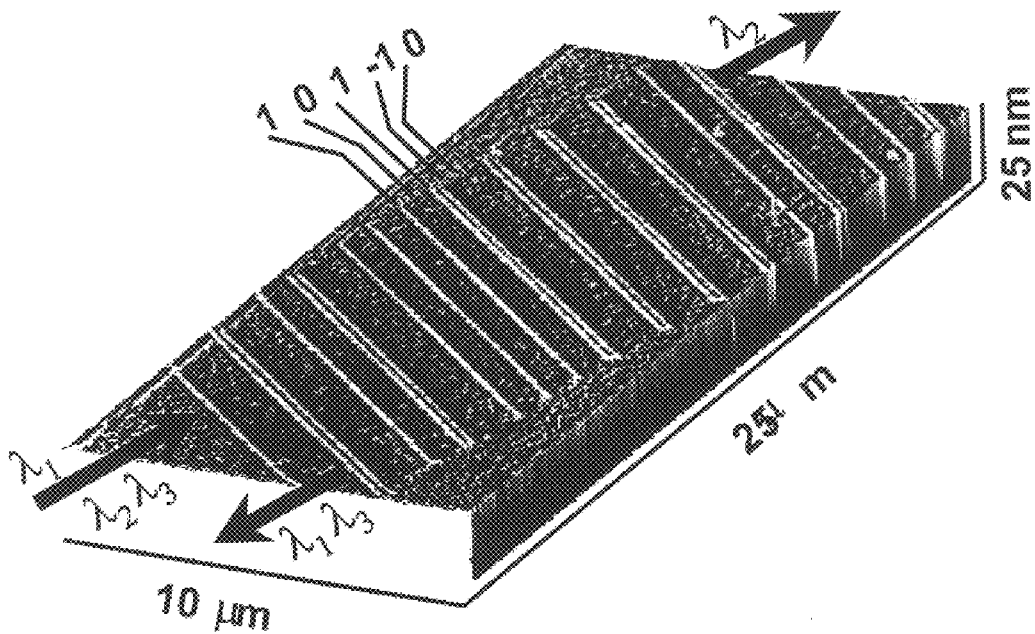

Figure 6. A non-periodic silicon dioxide grating that has been direct written on a silicon surface using an atomic force microscope. The structure (which also was profiled by an AFM) is annotated with wavelengths and stripe reflectances in the same manner as the proposed filter of Fig. 1c. The closest spacing of adjacent lines in this AFM profile is 240 nm for a 1 followed by a -1.

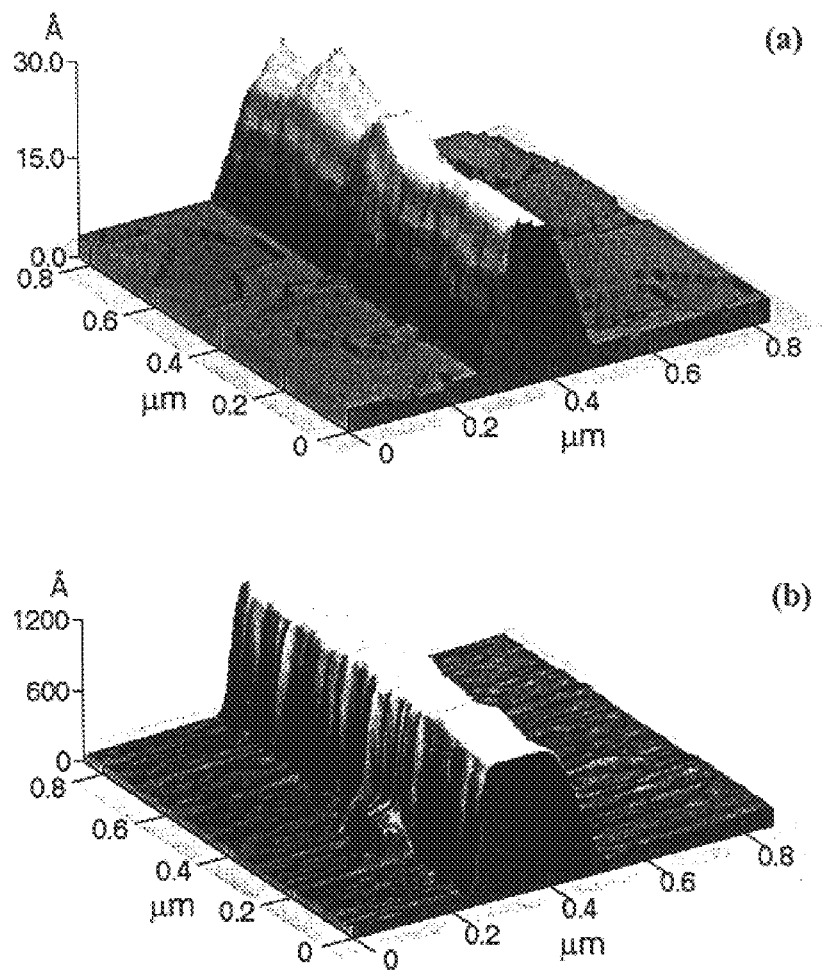
Figure 7. Close up AFM profiles of (a) oxide line on (110) silicon and (b) same line after anisotropic wet chemical etching in TMAH.

NANOLITHOGRAPHY FOR MULTI-PASSBAND GRATING FILTERS

STATEMENT OF GOVERNMENTAL INTEREST

The invention described herein may be manufactured and used by or for the Government for governmental purposes without the payment of any royalty thereon.

BACKGROUND OF THE INVENTION

The present invention relates generally to nanolithography, and more specifically the invention pertains to a fabrication efficient method of designing multi-passband grating filters.

Periodically spaced arrays are known to strongly reflect plane waves of specific temporal frequencies determined by phase matching between the wave vector and the grating period. These structures have been applied as filters in distributed feedback laser diodes, distributed Bragg reflector fiber optic filters, planar integrated optics and volume holography. In the earliest implementations of these devices, it was common to interfere two plane waves in photosensitive films such as photoresists, photographic film, or photorefractive media to produce gratings having single wavelength reflection passbands. However, a much more general range of frequency responses is available by individually setting the position and reflectivity of each reflector in a grating. For example, filters that have multiple passbands can be designed, and it even is possible to specify different levels of attenuation and bandwidth for each passband. The generalized filter functions provide important building blocks for wavelength multiplexing, demultiplexing, sorting and routing functions for fiber communications systems.

The use of atomic force microscopes in fabrication processes is disclosed in the following U.S. Patents, the disclosures of which are incorporated herein by reference:

U.S. Pat. No. 5,883,705, Mar. 16, 1999, Atomic force microscope for high speed imaging including integral actuator and sensor, Minne, Stephen;

U.S. Pat. No. 5,880,012, Mar. 9, 1999, method for making semiconductor nanometer-scale wire using an atomic force microscope, Ha, Jeung-Sook; and U.S. Pat. No. 5,252,835, Oct. 12, 1993, Macining oxide thin-films with an atomic force microscope: pattern and object formation on the nanometer scale, Lieber, Charles.

While SPMs can provide nearly complete analog control of grating parameters, it is usually desirable if the number of fabrication variables can be reduced. This can accelerate the development, verification and, especially, the calibration of the fabrication processes. Achieving this partial control then establishes the level needed to begin developing more extensive analog control of the device parameters. Following this basic philosophy we introduce a fabrication efficient method of designing multipassband filters, as described below.

SUMMARY OF THE INVENTION

The present invention uses the atomic force microscope as a direct-write tool for fabricating multi-passband integrated optical filters. Because of its simpler fabrication a grating structure is proposed that consists of identical stripes that are non-periodically spaced. The recently developed pseudorandom encoding method from the field of computer generated holography is modified to effectively assign analog reflectances at each point along the grating by selective withdrawal and offsetting of the stripes from a periodic spacing. An example filter designed by this method has two 1.5 nm bandwidth passbands and −23 dB of rejection for lightly coupled stripes. As with single band filters, the passbands broaden as the coupling increases. A calculation of the coupling coefficient of stripes on a fundamental mode, slab waveguide indicate that stripes on the order of 100 nm in depth and width support low insertion loss, multipassband filtering applications at visible wavelengths. Lines of these dimensions patterned with an AFM on (110) silicon indicate the feasibility of fabricating these filters. These conclusions are specific to current AFMs that are limited to writing fields of 100 $\mu$m. Increased rejection and decreased passband widths will result from incorporating precise field-stitching into future AFMs.

FIGURE CAPTIONS

FIG. 1. Types of reflection filters. (a) Periodic reflectors which cause unit amplitude reflections that are separated by optical path differences of period $\lambda_o$, (b) aperiodic reflectors that through offsets and variable reflection strengths represent arbitrary complex valued reflectances, (c) proposed aperiodic structure that through $\lambda_o/2$ offsets and pseudorandom encoding algorithms represents the continuum of real values between −1 to 1, (d) proposed aperiodic structure with tilted reflectors. The dotted lines indicate the sampling grid for the periodic filter.

FIG. 2. Pseudorandom encoding of dual passband filter. (a) Desired real-valued reflectances and the desired function encoded with the three available values −1, 0 and 1. (b) The reflectance power spectra derived from the Fourier transforms of the temporal functions in (a). The thin line is the spectrum for the desired function and the thick line is the spectrum for the encoded function.

FIG. 3. Bandwidth at −3 dB of peak intensity for a single passband (512 period) grating filter and the dual passband grating filter as a function of filter insertion loss. The correspondence between the COM (coupling of modes) and DL (discrete layer) analyses for the periodic structure indicates the validity of the DL analysis for the analysis of the non-periodic dual passband filter.

FIG. 4. Reflectance spectra for the dual passband filter design. The DL analyses (thick lines) are shown for filter insertion loss (i.e. peak intensity reflectance at centerband) of (a) 0.068, (b) 0.532 and (c) 0.917. The spectrum for the dual passband design from FIG. 2 is also replotted (thin line) for comparison. The reflectance spectra are normalized so as to bring their sidelobe structure into correspondence with the design spectrum.

FIG. 5. Reflected wave coupling strength for a periodic grating on a symmetric slab waveguide. The results shown are for the fundamental TE mode of the guide, guiding layers of thickness between 0.5 and 3.0 $\mu$m, and a 50% duty cycle grating of 512 periods. The curves are for cladding index $n_c=1$ and for guide index (a) $n_g=1.5$ and (b) $n_g=1.05$.

FIG. 6. A non-periodic silicon dioxide grating that has been direct written on a silicon surface using an atomic force microscope. The structure (which also was profiled by an AFM) is annotated with wavelengths and stripe reflectances in the same manner as the proposed filter of FIG. 1c. The closest spacing of adjacent lines in this AFM profile is 240 nm for a 1 followed by a −1.

FIG. 7. Close up AFM profiles of (a) oxide line on (110) silicon and (b) same line after anisotropic wet chemical etching in TMAH.

DETAILED DESCRIPTION OF THE PREFERRED EMBODIMENT

The present invention uses the atomic force microscope as a direct-write tool for fabricating multi-passband integrated optical filters. The reader's attention is directed towards FIGS. 1a–1d which illustrate four types of reflection filters.

Periodically spaced arrays are known to strongly reflect plane waves of specific temporal frequencies determined by phase matching between the wave vector and the grating period. These structures have been applied as filters in distributed feedback laser diodes, distributed Bragg reflector fiber optic filters, planar integrated optics and volume holography. In the earliest implementations of these devices, it was common to interfere two plane waves in photosensitive films such as photoresists, photographic film, or photorefractive media to produce gratings having single wavelength reflection passbands. However, a much more general range of frequency responses is available by individually setting the position and reflectivity of each reflector in a grating. For example, filters that have multiple passbands can be designed, and it even is possible to specify different levels of attenuation and bandwidth for each passband. The generalized filter functions provide important building blocks for wavelength multiplexing, demultiplexing, sorting and routing functions for fiber communications systems.

Since such reflector spacings are non-periodic, the original interferometric exposure methods (such as described in Kashyap, *Fiber Bragg Gratings*, 1999) cannot be used and more general patterning methods are required. These patterning methods require placement precision and feature sizes that are finer than for periodic gratings. For gratings designed for visible laser wavelengths, the pitch of a periodic grating can be on the order of 250 nm (which corresponds to half the wavelength at the center frequency of the grating.) Therefore resolution and line widths several times finer than the optical wavelength of interest are required to fabricate generalized non-periodic gratings.

Patterning systems with precision 2 to 3 orders of magnitude finer than visible wavelengths already exist and can provide essentially arbitrary control over the grating structures. For example, todays highest performance electron beam pattern generators direct-write lines as small as 30 nm. However, commercially available surface profiling microscopes (SPMs) also have placement resolution finer than 1 nm within a field of view of 100×100 $\mu$m. Various proximal probe writing methods have been demonstrated using surface profiling microscopes (including atomic force, surface tunneling and near-field optical scanning microscopes) and line widths as small as 10 nm have been reported. Furthermore, the increasing availability and the lower cost of SPMs make it reasonable to consider their application for direct-write nanometer-scale lithography—especially during the development and prototyping of devices where writing speed of the SPM is not a critical concern.

While SPMs can provide nearly complete analog control of grating parameters, it is usually desirable if the number of fabrication variables can be reduced. This can accelerate the development, verification and, especially, the calibration of the fabrication processes. Achieving this partial control then establishes the level needed to begin developing more extensive analog control of the device parameters. Following this basic philosophy we introduce a simplified device (FIG. 1c) that differs from a periodic grating in the following ways: (1) Rather than locating the reflective stripes on half wavelength spacings, the stripes are placed on quarter wavelength spacings; (2) Rather than placing a stripe at each half wavelength position, there is a mathematical prescription for writing, or not writing a stripe on each quarter wavelength spacing. The second difference provides a mechanism for effectively realizing a desired analog valued reflectance without resorting to varying the width or depth of individual stripes. Therefore, the new grating structure is also simplified over a fully analog aperiodic grating in that (1) the stripes are located on quarter wavelength centers rather than positioned anywhere on a continuum and (2) the reflectivity of all the stripes are identical rather than varied in an analog fashion. These fabrication constraints provide adequate flexibility to demonstrate multipassband filters.

Therefore the main objective of this invention is to show a fabrication efficient method of designing multipassband grating filters. A second objective is to show how the design of grating filters specific to fabrication constraints can be further generalized. This philosophy and approach to filter design is analogous to the methods from the field of computer generated holography. Specifically, the temporal frequency response of a grating is mathematically similar to the spatial frequency response (i.e. the far-field diffraction pattern) of a monochomatically illuminated computer generated hologram (CGH). This similarity can be used to directly encode a desired complex-valued temporal function/impulse response into a grating. The Fourier transform of this function is the desired temporal frequency response. These similarities are used to adapt CGH methods, specifically the recently developed pseudorandom encoding methods, to the design of a multipassband filters. In the discussion below a specific dual passband filter is specified using the CGH algorithm and the range of validity of the design algorithm is evaluated using a coupling of modes analysis that models the frequency response of the grating when it is implemented as a slab waveguide. The analysis accounts for multiple reflections in the grating as a function of width and depth of the grating stripes. A discussion follows that describes our initial efforts at fabricating a non-periodic grating using an atomic force microscope (AFM). This grating provides a physical example of the proposed grating structure.

CGH Design Algorithm For Specifying Multipassband Grating Filters

The CGH design approach focuses on using limited modulation values of the particular device to represent fully complex transmittances. This section follows this method and adapts it to the problem of using very simple stripe geometries, that are easier to fabricate, to represent arbitrary complex-valued reflectances.

Complex-valued Gratings

Consider the case, illustrated by FIG. 1b, of a plane wave incident on an array of reflective stripes. At this point of the analysis we assume that the grating is weakly reflective so that the effect of multiple reflections can be ignored. Then the frequency response of the grating's impulse response is known to be eq. (1)

$$F(v) = \sum_{i=1}^{N} a_i \exp(j2\pi t_i v)$$

where $a_i$ is the (real-valued) reflectance, $t_i$ is the time delay produced by the i=th stripe of the N stripe grating and v is the temporal frequency of the light. The stripe reflectance can be interpreted as being complex-valued by rewriting eq. (1) using the definitions $v=v_0+\delta v$ and $t_1 \equiv it_0+\delta t_i$ where $\delta t_i$ are the offsets of the stripes $it_0$ from a perfectly periodic grating, and $\delta v$ is the frequency offset from the center frequency $v_0$. Multiplying out these terms in the argument of the exponential in eq. (1) yields a product of four complex exponentials. One term is $\exp(j2 \pi \delta v \delta t_i) \approx 1$ for frequency ranges of concern $\delta v \ll v_0$. This condition is usually easy to meet in current wavelength division multiplexing systems where laser tuning ranges and system bandwidths are usually less than 100 nm. Ignoring this term leads to eq. (1) being approximated as eq. (2)

$$F(v) = \sum_{i=1}^{N} a_i \exp(j\varphi_i)\exp(j 2\pi i t_0 v)$$

where $\phi_i \equiv 2\pi v_0 \delta t_i$ is the nominal phase shift produced by offsetting the stripe positions from those of a periodic grating. Eq. (2) is the Fourier transform of a periodic grating in which the stripes have fully complex valued reflectances. Thus, for a wide range of optical frequencies over which eq. (2) is valid nearly arbitrary frequency responses can be designed based on the values selected for the number of stripes, and the magnitude and phase of the stripe reflectances.

The CGH Design Philosophy

From the beginnings of computer generated holography until today a critical issue has been how to represent complex valued spatial modulation with devices that do not produce arbitrary complex valued modulation. Modulating a monochromatic plane wave with arbitrary complex-valued modulation would produce far-field diffraction patterns that, with the replacement of x position for v, are identical in form to eq. (2). However, in this field of research the cost of implementing fully complex spatial light modulators has been considered to be difficult and costly. For this reason numerous methods of encoding fully complex valued modulation have been explored and developed specific to the modulation properties of various media. Some general classes of modulating devices include amplitude-only, phase-only, and various degrees of coupling between amplitude and phase. Another classification is if the modulation values at an individual point are continuous or discrete. These and other factors, as well, have stimulated many novel methods of encoding complex valued functions. The CGH design problem, in its similarity to the grating filter design problem, offers a useful source of ideas and insight for developing encoding schemes suited to the fabrication constraints of grating filters.

An Encoding Algorithm For Multipassband Filters

Following the CGH design philosophy the first step in a design is to identify the available modulation values that can be implemented. Then an encoding scheme is developed to represent all the modulation values needed to design a spectrum. In this invention we apply this approach to the design of a dual-passband grating filter. As discussed below, it is desirable to achieve the filter function with the simplest fabrication processes possible. For this reason we have specified a lithography in which each stripe is identical in geometry and stripes are written on a periodic grid corresponding to a sample spacing of $\lambda_0/2$ optical path difference where $\lambda_0$ is the wavelength at center frequency $v_0$. This prescription allows reflectance values of 1, 0 and −1 to be implemented. From these values an encoding method is developed that effectively realizes a continuum of reflectances from −1 to 1. This particular algorithm is by no means the only possible CGH algorithms that could be employed, but its numerically simple implementation makes it especially useful for purposes of illustration.

In passing we note that the particular encoding method can be generalized from real, to complex-valued representations if the grid locations on which the reflectors can be positioned is reduced from $\lambda_0/2$ to $\lambda_0/3$. Then the CGH method of ternary-valued encoding can be applied with consequent improvements in the accuracy of the encoding to approximate the desired spectrum. Even finer placement resolutions lead to even more accurate encoding methods. The writing of thinner lines is also desirable in that the SPM writing speed can be increased. However, thin lines must be etched more deeply to produce reflection strengths equal to those of thicker lines. The relationship between etch depth and reflectance is considered further in Sec. III. For the frequency responses developed here, positive and negative real valued modulation is sufficient and provides the least strict requirements on line width and placement accuracy.

Defining a Minimum Set of Available Reflectance Values For the Fabrication Method Each stripe will be limited by the fabrication process to be identical. Therefore $a_i$ the magnitude of the reflectance of each stripe is identical. However, there is the option to not place a stripe at certain locations on the sampling grid. Therefore, either a unity amplitude "1" or a zero amplitude "0" can be realized at each sample point of the grid. In general, any phase $\phi_i = 2\pi \delta t_i/t_0$ can be realized by offsetting/delaying the stripes from the $\lambda_0$ sampling points on the grid. We however limit the offsets to 0 or $\lambda_0/2$. Therefore, the phases of the reflectances can be either 0 (for $\delta t_i=0$) or *** (for $\delta t_i=t_0/2$). The complex reflectances $a_i \equiv a_i \exp(j\phi_i)$ in eq. (2) that can be realized are "1", when a stripe is written at the $i\lambda_0$ sampling point of the grid, "−1" when a stripe is written at the $(i+\frac{1}{2})\lambda_0$ sampling point on the grid, and "0" when a stripe is written at neither of the two sampling points. [While also possible, we do not consider the possibility of stripes being written simultaneously at both the $i\lambda_0$ and $(i\lambda+\frac{1}{2})\lambda_0$ locations.]

Pseudorandom Encoding: A CGH Algorithm For Encoding Fully Complex Values

One recently developed class of CGH methods that can be adapted to the problem of encoding continuous valued reflectances with only the three amplitudes −1, 0 and 1 is referred to as pseudorandom encoding. A specific algorithm already developed for the case of bi-magnitude SLMs will be used. Given two available values of magnitude 0 and 1, bi-magnitude pseudorandom encoding can represent/encode any desired magnitude $a_{ci}$ between 0 and 1. Used together with the additional sign reversal available by offsetting a stripe a half wavelength, all desired amplitudes between −1 and 1 can be encoded. The basic algorithm and the results of a theoretical performance analysis are given here.

In pseudorandom encoding the magnitude $a_i$ for the i th stripe is selected using a random number generator. Specifically, the random number generator is configured to produce random numbers from the probability density function (pdf) eq. (3)

$$p(a_i)=a_{ci}\delta(a_i-1)+(1-a_{ci})\delta(a_i)$$

where $\delta(\circ)$ is the Dirac delta function, and $a_{ci}$ is the probability of selecting the magnitude to be $a_i=1$ and $1-a_{ci}$ is the probability of selecting the magnitude to be $a_i=0$. The expected value of the random variable that has the pdf in eq. (3) is eq. (4)

$$<a_i>=1\cdot a_{ci}+0\cdot(1-a_{ci})=a_{ci}$$

where $<>$, is the expectation operator. This shows that for bi-magnitude random selection that the probability of selecting a 1 is identical to the desired magnitude $a_{ci}$. Therefore, any value of $a_{ci}$ between 0 and 1 can be realized by using a binary random number generator to select a 1 stripe with a relative frequency $a_{ci}$ and a 0 stripe with a relative frequency of $1-a_{ci}$. Evaluating the Fourier transform of the expected grating reflectance shows that the on-average frequency response is eq. (5)

$$\langle F(v) \rangle = \sum_{i=1}^{N} a_{ci} \exp(j 2\pi i t_0 v)$$

which with $a_{ci} = a_i \exp(j\phi_i)$ is identical in form to eq. (2). Thus in an average sense, pseudorandom encoding produces desired frequency responses. The quality of the encoding method is understood by evaluating the expected power spectrum, which is found to be eq. (6)

$$\langle I(v) \rangle = |\langle F(v) \rangle|^2 + \sum_{i=1}^{N} a_{ci}(1 - a_{ci})$$

The second term of eq. (6) indicates that each stripe contributes an identifiable amount of noise. The most noise is 0.25 (when $a_{ci}=0.5$). The noise contributions approach zero as the values of the desired magnitudes $a_{ci}$ approach either 1 or 0.

It should be noted that random bi-magnitude selection was applied previously to surface acoustic wave filters. Specifically, this invention is referred to as the withdrawal weighted interdigital transducer. However, the principle of pseudorandom encoding is much more general and can be applied to a near infinite variety of modulator characteristics.

Design and Coupled Mode Analysis of a Multipassband Filter

In this section the bi-magnitude pseudorandom encoding algorithm is applied to the design of a dual passband filter. Then the design is validated by evaluating it with a coupling of modes analysis that incorporates the effects of multiple lections. Finally the influence of stripe width and depth on filter insertion loss is evaluated.

Fabrication Constraints on the Design

The impulse response of the grating is designed to cover optical path differences of $512\lambda_0$ or an ~100 µm field of view for $\lambda_0=640$ nm. For an effective refractive index of $n_e=1.5$ a grating filter of the form of FIG. 1c would occupy 109 µm. Thus $\lambda_0$ optical path difference would correspond to a pitch of $\Lambda=213$ nm. However, since the layout in FIG. 1c permits stripes (say a −1 and a 1 in sequence) to be written as close together as $\Lambda/2=107$ nm. Therefore, considering limits on making perfectly vertical sidewalls, line widths of even less than 100 nm are generally required for the bi-phase grating.

Grating Specification and Encoding

Based on the AFM field of view constraint we choose to design a dual passband filter that consists of N=512 reflectances $a_i$. The reflectances are proportional to 1, 0 or −1 where the negative value is produced by using a $\lambda_0/2$ retardation to introduce a η phase reversal. Continuous real valued magnitudes $a_{ci}$ are encoded using the pseudorandom algorithm.

The function that is encoded is the continuous curve in FIG. 2a. This function is a modified Dolph apodization multiplied by a sinusoid. The Fourier transformed spectrum of this function is shown in FIG. 2b. The sinusoidal modulation introduces two passbands centered ±7 nm around the center frequency 640 nm. The Dolph apodization is known to reduce the sidelobes the greatest amount for a given broadening of the passband. The Dolph function is infinite in extent, but here it has been truncated at a maximum magnitude of 0.077. This sacrifices the sidelobe level somewhat, but for a fixed field of view grating the passband is narrower than if the Dolph weights were allowed to decay to near zero. The modified Dolph apodization produces a −35 dB sidelobe level and a −3 dB bandwidth (i.e. full width at half maximum power) of 1.5 nm. This can be compared with the frequency response for 512 periodically spaced, unit strength reflectors. The periodic filter would have a sidelobe level of −13 dB and a passband bandwidth of approximately $\lambda_0/N=1.25$ nm, however the actual −3 dB bandwidth found numerically is 1.1 nm.

The encoded function is represented by the dots of values 1, 0 and −1 in FIG. 2a. As prescribed by pseudorandom encoding, desired values close to 1 are usually, but not always, represented by $a_i=1$. Likewise values close to 0 and −1 are most frequently represented by those values. The Fourier transform of the encoded values $a_i$ produces the spectrum (thick line) in FIG. 2b. The bandwidth of each passband is 1.5 nm and the highest sidelobe level is −23 dB. The sidelobe level lects the noise introduced by the noise term (i.e. the summation) in eq. (6). The average noise level calculated from this term is −24 dB below the peak of the passband. Thus the sidelobes from the apodization are low enough that the noise from the encoding procedure is the principal contributor to the sidelobe level. The sidelobe level can be improved by using more samples in the filter. This could be achieved by designing for even shorter wavelengths or by increasing the field over which the patterning tool can write. Increasing the writing field would also allow the passbands to be narrowed further.

Evaluation of Non-periodic Grating Filters and Stripe Coupling Strength

The frequency response of a periodic corrugated waveguide has been analyzed using coupling of modes (COM) analysis by Kogelnik. Closed form COM solutions for non-periodic linear and quadratically chirped gratings were also developed by Kogelnik. However, a method of analyzing general non-periodic structures is needed. The analysis of arbitrary nonperodic gratings should be analogous to the Born and Wolf analysis of a stack of nonidentical etalons. Kogelnik has already adapted their method to propagation in a layered or stratified waveguide. Instead of propagation being parallel to the layers we consider the case of plane wave propagation normal to the layers. We only discuss the TE case, in which case the electric field is parallel to the stripes.

While we use the analysis to evaluate the spectrum of the dual passband filter, it does not by itself provide information on the dependence of grating lectance on the stripe width and depth. However, it is possible to relate the coupling coefficient K used in COM analysis of sinusoidally perturbed guides to the refractive index difference n between the two types of layers used in a periodic etalon stack. Furthermore K for a square wave grating on top of a slab waveguide has been directly related to that for a sinusoidal grating. These relationships are used to estimate the appropriate stripe geometry as a function of the magnitude of the grating reflectance. These analysis procedures are summarized and used to evaluate the performance and stripe geometry of the dual passband filter design in this subsection.

Discrete Layer Analysis

The wavelength dependent lectance of an etalon stack can be analyzed by cascading the reflection and transmission properties of the individual layers. For this Discrete Layer (DL) analysis, each layer is modeled using a 2×2 characteristic scattering matrix. Each section is designed to introduce a quarter wavelength optical delay $ln=\lambda_0/4$ where n is the refractive index of a particular layer and l is its physical length. The characteristic matrices for all the layers are multiplied in sequence and the resulting matrix is evaluated to give the frequency dependent complex reflectance.

For the proposed grating filter the sections that represent values of either 1, −1 or 0 are modeled as follows. Each section consists of two quarter wavelength layers. A 0 corresponds to two layers of refractive index n=1. A 1 corresponds to a layer with n>1 followed by a layer n=1. A −1 corresponds to a layer with n=1 followed by a layer with n>1, which is the reverse of the ordering used for the value 1. In this way the higher index layers represent stripes located at the desired positions in the proposed grating filter.

This method is adequately general for analyzing aperiodic structures. However, in order to relate the DL analysis to COM analysis it is useful to consider the special case for a periodic structure. Kogelik's analysis of the periodic, sinusoidally perturbed waveguide of length L and coupling coefficient K gives essentially identical results as the DL analysis of N pairs of quarter-wavelength layers that differ in refractive index by n if eq. (7)

$$\Delta n \equiv \kappa \lambda_0 / 2$$

We have also checked this correspondence through numerical simulation. We specifically evaluated a 512 period structure as a function of $\Delta n$ for both analyses. The DL geometry consists of 1024 layers of alternating refractive index n+$\Delta$n and n. The correspondence between the two models is compared in (FIG. 3) in terms of the −3 db bandwidth as a function of filter reflectance at center wavelength $\cdot_0$=640 nm. The results are identical for the two analyses except for small errors that are due to the small number of sample points used in calculating the spectra. The bandwidth broadening is a direct result of strong multiple reflections that saturate the frequency response around the center frequency. In each case identical centerband reflectances are found if the stacked etalon and COM analyses use values of $\Delta n$ and K that are related by eq. (7). These correspondences between the two analyses indicate that the DL analysis for the aperiodic filters will reasonably model our grating structures of interest.

Grating Depth Analysis

Yariv describes a method of calculating the coupling coefficient for TE waves propagating in a slab waveguide that is perturbed by a square wave corrugation. A closed form expression for the integral can be calculated from the unperturbed field distribution. For purposes of simplicity in presentation, we limit our analysis to symmetric slab waveguides.

Our evaluation by Yariv=s method gives eq. (8)

$$\kappa = \frac{\lambda \gamma_g \gamma_c}{8\pi^2 n_c (2 + h\gamma_c)\cos^2(h\gamma_g/2)} [2d\gamma_g + \sin(h\gamma_g) - \sin(h\gamma_g - 2d\gamma_g)]$$

where h is the thickness of the guiding layer, d is the corrugation depth, $n_c$ is the refractive index of the cladding, $n_g$ is the refractive index of the guiding region, and $n_e = \beta \lambda / 2\pi$ is the effective index for the guided wave having propagation constant $\beta$. The eigenvalues that describe the field are $\gamma_g$ for the guiding layer and $\gamma_c$ for the cladding regions. Yariv has presented an approximate expression for the equation for $\kappa$. This approximation is valid only for $h(n_g - n_c)/\lambda$ that is much greater than 1. However, this condition is valid only if the guide can support multiple modes. Eq.(8) is valid even for single mode guides.

Eq. (8) specifically describes for the fundamental waveguide mode and the fundamental Fourier series harmonic of a 50% duty cycle grating. The expression of coupling coefficient is $$\kappa_n = \kappa \sin(\eta \Delta)$$

generalized for a rectangular grating of any duty cycle according to where the term $\sin(\eta \Delta)$ is the ratio of the Fourier coefficient of a grating of duty cycle $\Delta$ to the coefficient for $\Delta = \frac{1}{2}$.

DL Analysis of the Dual Passband Filter

FIG. 4 shows representative spectra resulting from the DL analysis for values of $\Delta n$ of 0.0015, 0.0065, and 0.14 for a–c respectively in FIG. 4. For a centerband reflectance (i.e. insertion loss) of 0.068 (−11.7 dB) the DL analysis in FIG. 4a is nearly identical to the Fourier transform of the encoded function (from FIG. 2). For an insertion loss of 0.532 (−2.7 dB) the mainlobes in FIG. 4b are slightly saturated and the sidelobe are nearly identical to the designed spectrum. For insertion loss of 0.917 (−0.38) dB, FIG. 4c shows a strong intensity saturation and frequency broadening of the passbands. Again, the sidelobes are nearly identical to those of the designed spectrum. These results show that encoded design methods serve a useful role even when the passbands are heavily saturated; namely, improving rejection by shaping the sidelobe region. FIG. 3 summarizes the distortion from the designed spectrum in terms of bandwidth broadening for various levels of insertion loss. As with the periodic gratings the bandwidth increases with decreasing loss.

We also compared the values of $\Delta n$ used in the DL analyses of the periodic grating with the values of $\Delta n$ for the non-periodic grating. We found for equal insertion loss that $\Delta n$ was typically 3.7× greater for the aperiodic grating than for the periodic grating. This ratio is similar to the ratio of the peak magnitude of the Fourier transform of the periodic grating to that of the non-periodic grating which is 4.0×. Furthermore, since coupling coefficient in eq. (7) is proportional to $\Delta n$, the proportionality between $\Delta n$ for the periodic and non-periodic gratings gives some idea of the stripe depth required to achieve a desired level of insertion loss.

Analysis of Stripe Geometry

Eq. (8), the relationship between stripe depth d and coupling coefficient for a periodic grating of 50% duty cycle (where duty cycle is the ratio of stripe width to grating period) is evaluated in FIG. 5 for four values of guide thickness h=0.5,1, 2 and 3 $\mu$m. FIG. 5a shows the coupling coefficients for $n_g$=1.5 and FIG. 5b shows the coupling coefficient for $n_g$=1.05. In both cases $n_c$=1. In FIG. 5a the curves for h=0.5 and 1 $\mu$m correspond to single mode operation while all four curves in FIG. 5b are for single mode operation.

FIG. 5a shows coupling coefficients as large as 0.05. For the 512 period periodic filter −1 dB insertion loss (0.8 reflectance) corresponds to K=8.8 mm$^{-1}$. However, since the duty cycle $\Delta$ for the aperiodic grating is at most 25% to avoid overlap of stripes eq. (9) gives that $\kappa_n/\kappa \leq \sqrt{1/2}$. Additionally, since the peak amplitude of the periodic filter is 4× less than the dual passband filter for the same value of K then coupling of at least 50 mm$^{-1}$ is required to obtain dual passband filters with −1 dB insertion loss. FIG. 5a shows that −1 dB insertion loss is possible using stripes of depth ~50 nm for the 0.5 micron guiding layer and ~130 nm for the 1 micron layer. For the lower index guide of FIG. 5b, a coupling coefficient of only 0.01 is achieved for strip depths of ~70 nm and ~125 nm. Note however that reducing K by a factor of 14.4× reduces insertion loss from −1 dB to −20 dB. For the dual passband filter considered here, −20 dB corresponds to K=3.5 mm$^{-1}$. For the FIG. 5b curve the stripe depths would correspond to approximately 25 nm, 50 nm and 150 nm for the 0.5, 1 and 2 $\mu$m guides respectively. The point of this analysis is that there is substantial flexibility in adjusting stripe depth and width, and guiding layer thickness to obtain low insertion loss filters, lightly coupled wavelength selective drops, and intermediately coupled power splitters.

In passing we note that somewhat narrower stripes will not require significant increases in stripe depth, though substantially narrower stripes will. For example, for a duty cycle $\Delta=\frac{1}{6}$ a compensation $K/K_n=2$ in stripe depth is needed to obtain identical reflectivity as a 50% duty cycle grating, while for $\Delta=\frac{1}{32}$ a compensation of $K/K_n=10$ is needed. These results give some idea of the tradeoff between stripe depth and stripe width. Thus, while narrower stripes are desirable in that they allow finer placement with consequent improvements in line writing speed and enhanced performance encoding algorithms, this must be traded off with the requirements for increasing depth of the stripes. These limitations can be further compensated if filters having a greater number of stripes can be fabricated. Ways that the writing range of the AFM might be extended are considered further.

Initial Fabrication of Non-periodic Gratings For Multi-passband Reflection Filters FIG. 6 illustrates the device concept that has been explored in this invention. The figure shows a series of non-periodically spaced silicon dioxide stripes that were written on silicon and profiled using an AFM. Stripe positions corresponding to 1, −1 and 0 filter values are indicated. The closest spacing between adjacent lines is 240 nm for a 1 followed by a −1. FIG. 6 also shows how the wavelengths $\lambda_1$ and $\lambda_3$ would be separated from $\lambda_2$ for the dual passband design of Sec. III. Of course, complete separation (or any desired division) between the transmitted and reflected channel would require that the stripes are of the appropriate height to obtain close to 100% reflectance (i.e. 0 dB insertion loss). This section will describe initial material processing experiments aimed at obtaining fabrication control over the stripe geometry.

Silicon surfaces can be oxidized by applying large electric potential to them. Various studies have shown proximal probe oxidation process using a biased surface tunneling or atomic force microscope tips. Many other writing modes of surface profiling microscopes (SPM) and various material systems have been reported that could be employed for fabricating optical devices. Our writing experiments are performed with (110) n-type silicon. Prior to writing the wafer is cleaned and the native oxide layer is removed by immersing the wafer in HCl:H$_2$O$_2$:H$_2$O (3:1:1) at 70° C. for 10 min followed by 20–30 sec etching in a 40:1 HF solution. The surface roughness, as measured by the AFM, is less than 0.3 nm (rms) if the wafer is processed soon after the residual oxide is removed.

The oxide lines are written with a Park M5 AFM in room air. A silicon contact mode tip (UL06) mounted on the conductive holder is biased between −5 to −10 V and the sample is grounded. The resistance between the sample surface and ground was measured to be 1000Ω. The tip is placed in contact with the sample and then moved over the surface to write a line. The amount of oxide and the thickness of the line depends on the voltage and the amount of time that the AFM tip is in contact with the sample. After writing the oxide is profiled with the AFM.

We have written oxide lines that vary in width from 100 nm to 400 nm and that vary in height from 0.5 to 2.0 nm. The width refers to the maximum width of the base that can be detected by the AFM. This is limited by AFM height resolution to 0.08 nm. To the eye, the shape of the oxide appears to be gaussian (FIG. 7a). A 120 nm width oxide line was produced with an applied voltage of −10 V and a scan speed of 2 $\mu$m/sec. Slower scanning speeds or multiple passes over the same region produce wider lines. These oxide lines can be used as a mask to etch substantially deeper lines.

Based on the analyses, it would be possible to obtain adequately strong coupling with 2 nm thick stripes over a very thin guiding layer. However, we have concerns about residual surface roughness of the wafer and for these reasons deeper stripes appear desirable. Crystalline materials, such as silicon can be anisotropically etched using wet chemical processing. Objections to the limited number of crystalline materials available can be overcome by using three dimensional pattern transfer methods. Furthermore, nearly vertical sidewalls can be produced in a much wider variety of materials by reactive ion etching.

In our first experiments we consider anisotropic wet chemical etching of silicon. In particular we choose (110) silicon because the (110) plane is known to etch as much as 100× faster than the (111) plane for specific etchants. Thus by writing oxide lines on the surface of (110) silicon that are parallel to the wafer flat we anticipate that near vertical sidewalls corresponding to the (111) plane will be formed. The AFM written silicon dioxide lines are oriented in this way.

A single wafer containing lines of various widths is wet etched at 90° C. in a solution containing 83 ml of 25% wt. tetramethyl-ammonium hydroxide (TMAH) and 17 ml of isopropyl alcohol for 15 sec. AFM profiles of the etched structures reveals several interesting results. (1) The thicker oxide lines etch to a depth of ~100 nm while the thinner lines etch to depths of ~50 nm. (2) The typical sidewall slope is 30° from vertical. (3) Thicker lines have a flat surface between the sidewalls while the thinner lines form a continuously curved hillock. These results suggest that the thin edges of the oxide are not protecting the line during the entire etch. For the very thin lines the oxide is being completely undercut and removed. FIG. 7 shows one of the lines before (FIG. 7a) and after etch (FIG. 7b). The width across the base of the line is ~250 nm both before and after etch. After etch the width of the plateau of the line has narrowed to ~100 nm. Additional studies are needed to find ways to better protect silicon from etchants, such as modifying oxide shape or optimizing the properties of the etchant. Alternatively, different material processes altogether may lead to lines of the desired width and depth.

We have considered the possibility of generalizing the frequency response of grating reflection filter by employing signal encoding techniques from computer generated holography. A specific case of a grating on a slab waveguide has been considered. Fabrication constraints set by the limited field of view of current AFM patterning systems have been considered. One consideration is that encoded functions generally have lower intensity frequency responses than do periodic structures of the same length. In order to compensate for these differences the stripes must be correspondingly deeper than for periodic structures in order to obtain equivalent insertion losses. Likewise, the use of phase reversed strip placement for the dual passband filter requires narrower stripes which also requires deeper stripes. Even greater depths (or thinner guiding layers) will be needed to extend this approach from bi-phase to polyphase encoding algorithms. Already for some of the examples considered here, stripe aspect ratios (depth over width) in excess 1:1 have been found.

These aspect ratios can be reduced for designs having more stripes. Current AFM=s (unlike ebeam pattern generators) do not include high precision stages necessary to stitch together multiple fields. At least two reasonable extensions are possible:

(1) Two gratings could be placed in close proximity to each other. A short region that is unperturbed by a grating is placed between the two sections. The guided wave velocity can be compensated by depth etching, to properly phase the two sections together. A single etch depth (i.e. identical etch conditions) can be used for phasing any two sections if the length of the guided region that is exposed to etchant is varied.

(2) While commercial AFMs are quoted with around 2–3 $\mu$m of stage positioning error, it would be possible to use the AFM head itself to determine exactly where the stage moves to. The previously written pattern (or other prewritten fiducials) can be identified through AFM scanning and the measured offset (and possibly tilt) errors can be used to offset (and possibly rotate) the patterning instructions. This is a quite reasonable approach if one has the ability and adequate time to modify the AFM control software.

There are various applications and configurations of multipassband grating filters. A single grating customized to the demands of a subscriber can be used to tap off a number of non-sequential frequency channels from a wavelength multiplexed fiber channel. Slanted gratings (FIG. 1d) can be used to form wavelength selective crosspoints. Arranging these crosspoints an x-y fashion on a single substrate can be used to realize various other network topologies. Programmable filters can also be envisioned in which arrays of stripes can be individually placed in or removed from the beam path. Electrostatic attraction could be used to displace the stripes in a manner similar to micromechanical mirror array technology of Texas Instruments that is currently used in video projectors and printing engines. CGH encoding algorithms, such as those described provide the flexibility and adaptivity to design and compute desired filter functions instead of storing large tables of anticipated stripe settings.

In summary this invention has considered the possibility of nanofabricating multipassband grating filters using current AFMs as direct write patterning tools. We have demonstrated that useful designs are possible even with the limited writing field of current AFMs and that there are approaches that can permit precise field stitching. Writing times are currently quite slow but not critical for using AFMs to develop single experimental or prototype devices. Current writing speed can be increased by using a controlled atmosphere for the silicon oxidation process or using different material systems which are known to be faster.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process of fabricating optical gratings, wherein said process comprises the step of using an atomic force microscope for a direct-writing tool for nanolithography to encode a predetermined pattern in an optical grating, wherein said predetermined pattern is performed by pseudorandom encoding said predetermined pattern onto an optical grating through use of a computer-generated holography with said atomic force microscope as the direct writing tool.

2. A process, as defined in claim 1, wherein said predetermined pattern forms a multi-passband optical filter.

* * * * *